US006417013B1

(12) United States Patent
Teixeira et al.

(10) Patent No.: US 6,417,013 B1
(45) Date of Patent: *Jul. 9, 2002

(54) MORPHED PROCESSING OF SEMICONDUCTOR DEVICES

(75) Inventors: Michael J. Teixeira, Lutz; Mike Devre, Safety Harbor; Wade Dawson, St. Petersburg; Dave Johnson, Palm Harbor, all of FL (US)

(73) Assignee: Plasma-Therm, Inc., St. Petersburg, FL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/239,723

(22) Filed: Jan. 29, 1999

(51) Int. Cl.[7] .................. H01L 21/00; H01L 21/66; G01R 31/26; C30B 23/00; C30B 28/12
(52) U.S. Cl. ................... 438/5; 438/14; 438/9; 117/85
(58) Field of Search ............. 438/9, 14, 5; 117/85, 117/86; 216/67; 427/10

(56) References Cited

U.S. PATENT DOCUMENTS

| 3,940,506 A | | 2/1976 | Heinecke |
|---|---|---|---|
| 4,201,645 A | | 5/1980 | Riegert |
| 4,349,409 A | | 9/1982 | Shibayama et al. |
| 4,500,408 A | * | 2/1985 | Boys et al. ............... 204/298 |
| 4,500,563 A | | 2/1985 | Ellenberger et al. |
| 4,529,475 A | | 7/1985 | Okano et al. |
| 4,533,430 A | | 8/1985 | Bower |
| 4,579,623 A | | 4/1986 | Suzuki et al. |
| 4,585,516 A | | 4/1986 | Corn et al. |

(List continued on next page.)

FOREIGN PATENT DOCUMENTS

| EP | 0 160 220 A1 | 11/1985 |
|---|---|---|
| EP | 0 246 514 A2 | 11/1987 |
| EP | 0 350 997 A2 | 1/1990 |

(List continued on next page.)

OTHER PUBLICATIONS

Dennis W. Hess, Plasma Etch Chemistry of Aluminum and Aluminum Alloy Films, *Plasma Chemistry and Plasma Processing*, vol. 2, No. 2, 1982, pp. 141–155.

K. Tsujimoto et al., A New Side Wall Protection Technique in Microwave Plasma Etching Using a Chopping Method, Extended Abstracts of the 18th (1986) International Conference on Solid State Devices and Materials, Tokyo, 1986, pp. 229–232.

(List continued on next page.)

*Primary Examiner*—John F. Niebling
*Assistant Examiner*—Walter L. Lindsay, Jr.
(74) *Attorney, Agent, or Firm*—Foley & Lardner (57) ABSTRACT

A method for controlling a variable parameter during a processing of a semiconductor device includes selecting a beginning and an ending value; selecting a function governing how the parameter is to be transitioned; initializing the parameter to the beginning value; and automatically transitioning the parameter according to the selected function. Another method includes selecting a criterion; determining a beginning value; receiving an input; determining from the input whether the parameter needs to be modified; and modifying the parameter. The methods can control the parameters of a Bosch process such that the steps of etching and plasma deposition are performed alternatingly while keeping the transition points arbitrarily small and providing increased control over the process and the resulting trench wall profile. The method applies to other types of semiconductor processing, including without limitation, other deposition and etching applications or processes.

28 Claims, 7 Drawing Sheets

U.S. PATENT DOCUMENTS

| | | | |
|---|---|---|---|
| 4,599,135 A | 7/1986 | Tsunekawa et al. | |
| 4,635,090 A | 1/1987 | Tamaki et al. | |
| 4,668,338 A | 5/1987 | Maydan et al. | |
| 4,707,218 A | 11/1987 | Giammarco et al. | |
| 4,784,720 A | 11/1988 | Douglas | |
| H566 H | 1/1989 | Nyaiesh et al. | |
| 4,795,529 A | 1/1989 | Kawasaki et al. | |
| 4,832,788 A | 5/1989 | Nemiroff | |
| 4,851,367 A | 7/1989 | Wolf | |
| 4,855,017 A | 8/1989 | Douglas | |
| 4,863,558 A | 9/1989 | Jucha et al. | |
| 4,878,995 A | 11/1989 | Arikado et al. | |
| 4,918,031 A | 4/1990 | Flamm et al. | |
| 4,985,114 A | 1/1991 | Okudaira et al. | |
| 4,992,136 A | 2/1991 | Tachi et al. | |
| 5,068,202 A | 11/1991 | Crotti et al. | |
| 5,079,178 A | 1/1992 | Chouan et al. | |
| 5,110,408 A | 5/1992 | Fujii et al. | |
| 5,236,549 A | 8/1993 | Shirakawa et al. | |
| 5,242,539 A | 9/1993 | Kumihashi et al. | |
| 5,250,451 A | 10/1993 | Chouan | |
| 5,273,609 A | 12/1993 | Moslehi | |
| 5,314,575 A | 5/1994 | Yanagida | |
| 5,314,578 A | 5/1994 | Cathey | |
| 5,352,324 A | 10/1994 | Gotoh et al. | |
| 5,354,418 A | 10/1994 | Kumihashi et al. | |
| 5,368,685 A | 11/1994 | Kumihashi et al. | |
| 5,405,492 A | 4/1995 | Moslehi | |
| 5,419,809 A | 5/1995 | Nagayama et al. | |
| 5,423,945 A | 6/1995 | Marks et al. | |
| 5,435,886 A | 7/1995 | Fujiwara et al. | |
| 5,460,689 A | 10/1995 | Raaijmakers et al. | |
| 5,474,650 A | 12/1995 | Kumihashi et al. | |
| 5,478,437 A | 12/1995 | Hashemi et al. | |
| 5,501,893 A | 3/1996 | Laermer et al. | 428/161 |
| 5,605,600 A | 2/1997 | Muller et al. | |
| 5,635,021 A | 6/1997 | Harafuji | |
| 5,664,066 A * | 9/1997 | Sun et al. | 395/23 |
| 5,854,138 A | 12/1998 | Roth et al. | |
| 5,932,488 A | 8/1999 | Takizawa et al. | |
| 6,051,503 A | 4/2000 | Bhardwaj et al. | |
| 6,071,822 A | 6/2000 | Donohue et al. | |

FOREIGN PATENT DOCUMENTS

| | | |
|---|---|---|
| EP | 0 363 982 A2 | 4/1990 |
| EP | 0 383 570 A2 | 8/1990 |
| EP | 0 482 519 A1 | 4/1992 |
| EP | 0 536 968 A2 | 4/1993 |
| EP | 0 561 402 A1 | 9/1993 |
| EP | 0 562 464 A1 | 9/1993 |
| EP | 0 822 582 A2 | 7/1997 |
| JP | 62-031123 | 2/1987 |
| JP | 62-065328 | 3/1987 |
| JP | 62-065329 | 3/1987 |
| JP | 62-102529 | 5/1987 |
| JP | 62-136066 | 6/1987 |
| JP | 63-073524 | 4/1988 |
| JP | 63-076432 | 4/1988 |
| JP | 63-110638 | 5/1988 |
| JP | 63-266829 | 11/1988 |
| JP | 01-140630 | 6/1989 |
| JP | 01-194325 | 8/1989 |
| JP | 01-276674 | 11/1989 |
| JP | 02-105413 | 4/1990 |
| JP | 02-309631 | 12/1990 |
| JP | 03-093224 | 4/1991 |
| JP | 03126222 | 5/1991 |
| JP | 3-129820 | 6/1991 |
| JP | 03-218627 | 9/1991 |
| JP | 04-045529 | 2/1992 |
| JP | 04-125924 | 4/1992 |
| JP | 04-181728 | 6/1992 |
| JP | 05-055175 | 3/1993 |
| JP | 05-267249 | 10/1993 |
| JP | 6-12767 | 1/1994 |
| JP | 06-061192 | 3/1994 |
| JP | 06-151360 | 5/1994 |
| JP | 07-066185 | 3/1995 |
| JP | 07226397 | 8/1995 |
| JP | 07-297177 | 11/1995 |
| JP | 08-017807 | 1/1996 |
| JP | 08-083779 | 3/1996 |
| JP | 08-172081 | 7/1996 |
| JP | 08-195385 | 7/1996 |
| JP | 08-250479 | 9/1996 |
| JP | 08-274071 | 10/1996 |
| JP | 08-279496 | 10/1996 |
| JP | 08-330275 | 12/1996 |
| JP | 09-162166 | 6/1997 |
| JP | 09-184082 | 7/1997 |
| JP | 09-232281 | 9/1997 |
| JP | 09-321051 | 12/1997 |
| JP | 10-229070 | 8/1998 |
| WO | WO 89/01701 | 2/1989 |
| WO | WO 94/14187 | 6/1994 |

OTHER PUBLICATIONS

L.M. Ephrath, Selective Etching of Silicon Dioxide Using Reactive Ion Etching with $CF_4$–$H_2$, J. Electrochem. Soc.: *Solid State Science and Technology,* vol. 126, No. 8, Aug. 1979, pp. 1419–1421.

* cited by examiner

MORPHED PROCESSING OF SEMICONDUCTOR DEVICES

BACKGROUND OF THE INVENTION

1. Field of the Invention

The invention disclosed broadly relates to the field of semiconductor fabrication, and more particularly relates to an automated process for changing parameters governing the etching and deposition processes for such fabrication.

2. Description of the Related Art

As semiconductor devices have become more highly integrated, there has been an increasing need for methods of anisotropically etching structures in the semiconductors, particularly in silicon. It is known in the art to use a reactive gas mixture containing a chemically reactive species and electrically charged particles, and to accelerate this gas mixture toward a substrate by means of an electrical pre-stress applied to the substrate. The charged ions, ideally, impact vertically on the substrate surface and promote a chemical reaction between the reactive gas and the substrate surface or etching base.

Favored techniques often involved using reactive gases based on fluorochemicals. This allowed a high etching rate and a high selectivity. Selectivity is the ratio of silicon etching to the mask etching. Typical masks include a photoresist layer or a $SiO_2$ layer. The fluorine-based reactive gas, however, also resulted in undesired underetching of the mask edges. Other techniques included the use of a polymer former in the gas mixture or plasma in order to coat the side walls and thereby reduce the underetching. These techniques, however, had lower selectivities and took considerably longer because the etching rate was markedly reduced. Further, use of polymer formers often resulted in underetching at greater depths in the substrate. Other techniques utilized reactive gases based on other halogens, particularly chlorine and bromine. These processes essentially etched only on the bottom of the structure or substrate and thereby reduced underetching of the mask edges, but were extremely sensitive to moisture and required costly transfer devices.

U.S. Pat. No. 5,501,893 by Laermer et al., assigned to Robert Bosch GmbH (the "Bosch patent") describes these processes and their limitations in more detail, and presents an advance that overcomes some of their disadvantages. The Bosch patent teaches performing anisotropic etching, that is, vertical wall etching, in two alternating stages of etching and polymerization. The polymerization effectively coats the side walls of the structure so that the subsequent etching stage can produce deep structures having near vertical edges. The separation of the polymer and the reactive gas mixture obviates the need to consider the ratio of fluorine radicals to polymer formers, and thus the process can be optimized with respect to etching rate and selectivity without adversely affecting the anisotropy of the total process.

The Bosch patent further teaches adding low ionic energy during the polymerization stages in order to prevent the formation of the polymer on the etching base. A further aspect of the process taught in the Bosch patent (the "Bosch process") is a useful mask selectivity due to the fact that only low ionic energies are required.

In applying the Bosch process, the deposition and etch cycles are performed, alternatingly, with a particular set of parameters or conditions for a specified number of iterations or loops, wherein one iteration includes both an etch cycle and a deposition cycle. After the specified number of iterations, the conditions are changed and the deposition and etch cycles are performed for another specified number of iterations. This process is repeated until the desired trench is completed. The loop sets and their process conditions are referred to as "process recipes." Typical process parameters that might be changed between loops sets include, without limitation, gas flow rate, pressure, step duration, and radio frequency ("RF") power.

One of the important system capabilities incorporated specifically for adaptation of the Bosch process is looping software. This enables the system to alternate efficiently between deposition and etch cycles as called for in the Bosch patent.

The Bosch etch process thus enables etching of deep anisotropic trenches over a wide aspect ratio range. The aspect ratio can be defined as the depth of the trench divided by the width of the trench. The basic capability of this process potentially provides MicroElectroMechanical Systems ("MEMS") design engineers the opportunity to apply MEMS technology in increasingly diverse areas. Many of these new applications require very precise control over trench wall profiles, including undercutting at the mask/silicon interface, as well as general profile control and variation over the entire depth of the trench.

Figure 1:
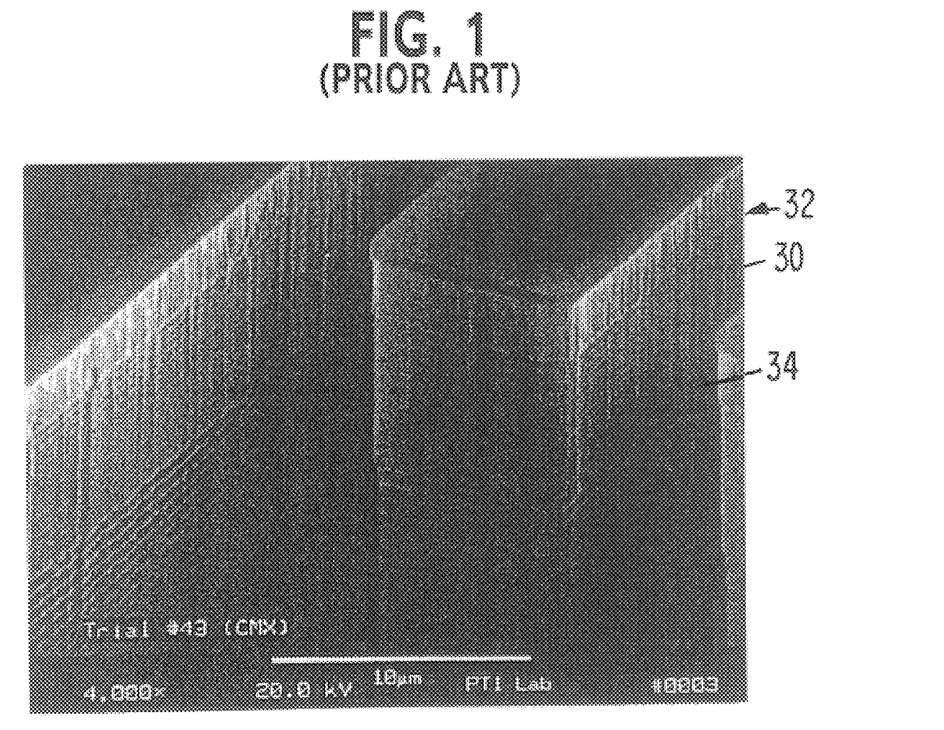
FIG. 1 depicts transition points from the Bosch process, according to the prior art.

The Bosch etch mechanism leads to certain undesirable effects given fixed aspect ratio, mask, and trench profile requirements. Among these effects is the presence of transition points on the trench walls where one set of conditions is ended and another set is initiated. Referring to FIG. 1, there is shown a trench wall 30 with two transition points 32, 34. Each of these transition points is the result of changing the process parameters.

The granularity of the transitions can be improved by increasing the number of loop sets and making smaller changes for each set. However, the number of sets of loops becomes a limiting factor because programming these process recipes is labor intensive. Additionally, even with many loop sets and small transitions between them, interruptions in the wall profile can still be detected when the trenches are viewed under high magnification. The existence and/or size of the transition points can be problematic for certain applications.

Further, as is well known in the art, trench profiles will change as a loop set, with fixed parameters, is run. The profiles tend to develop in a particular direction depending on the etch process conditions and the lengths of time that those conditions are run. A further limitation of the Bosch etch mechanism is a need to increase the number of loop sets, and to perform the labor intensive process of programming each loop set, in order to counteract these trench wall dynamics.

Both the transition points and the trench wall dynamics contribute to the creation of trench walls, or beams which do not go straight down from a mask edge. For many applications, the "ideal" beams are parallel to each other and have a constant spacing between them regardless of the depth. Such a geometry is desirable because the capacitive performance of many devices is extremely sensitive to the spacing of the walls. The spacing needs to be consistent to provide good performance and this need becomes more critical as the density of a device is increased and the beams are brought closer together. In addition to the sensitivity of the capacitive performance, the existence of transition points and the trench wall dynamics limits the ability to control the beams and to produce a specified profile, and this limitation also becomes more severe as the density of a device is increased.

The present invention is directed to overcoming or at least reducing the effects of one or more of the problems set out above.

SUMMARY OF THE INVENTION

Briefly, in accordance with one aspect of the present invention, there is provided a method for controlling a variable parameter during a processing of a semiconductor device, the method including selecting a beginning value and an ending value for the variable parameter, wherein the beginning value is not equal to the ending value; selecting a function governing how the variable parameter is to be transitioned from the beginning value to the ending value; initializing the variable parameter to the beginning value; and automatically transitioning the variable parameter according to the selected function.

Briefly, in accordance with another aspect of the present invention, there is provided a method for controlling a variable parameter during a processing of a semiconductor device, the method including selecting a criterion that describes a desired result of the processing; determining a beginning value for the variable parameter, based in part on the selected criterion; receiving during the processing of the semiconductor device an input that can be used to determine whether the variable parameter needs to be modified in order to satisfy the selected criterion; determining from the received input whether the variable parameter needs to be modified in order to satisfy the selected criterion; and modifying the variable parameter in an automated fashion in an attempt to satisfy the selected criterion.

Briefly, in accordance with other aspects of the present invention, there are provided computer program products including computer readable program code for performing each of the steps in the above methods.

Briefly, in accordance with yet other aspects of the present invention, there are provided systems for implementing the above methods.

BRIEF DESCRIPTION OF THE DRAWINGS

The above described features of the present invention will become more apparent upon reference to the following detailed discussion and the attached drawings.

DETAILED DESCRIPTION OF AN EMBODIMENT

In accordance with an aspect of the present invention, the functionality disclosed herein can be implemented by hardware, software, and/or a combination of both. This may be done for example, with a general purpose computer running software which implements a method described below and controls the semiconductor fabrication hardware. Moreover, this functionality may be embodied in computer readable media (also referred to as computer program products), such as magnetic, magnetic-optical, and optical media, used in programming an information-processing apparatus to perform in accordance with the invention. This functionality also may be embodied in computer readable media such as a transmitted waveform to be used in transmitting the information or functionality.

Although specific embodiments of the invention are disclosed, it will be understood by those having skill in the art that changes can be made to these embodiments without departing from the spirit and scope of the invention. The scope of the invention is not to be restricted, therefore, to any embodiment, and it is intended that the appended claims cover any and all such applications, modifications, and embodiments within the scope and spirit of the present invention.

An embodiment described herein has several advantages, including without limitation, (i) eliminating the need for the process engineer, or other, to program each set of loop parameters, (ii) allowing smaller changes to be made to the process parameters, and (iii) allowing for smoother transitions in trench profiles. The parameters can be generated automatically. This removes much of the time and labor previously required, and allows much smaller and virtually continuous changes to the process parameters. Discrete transition points can therefore effectively be eliminated, or at least substantially reduced.

Rather than placing many "digital" loop segments in series as in the prior art, an embodiment of the present invention was developed in which a number of important process parameters can be changed from an initial value to an ending value according to a user specified function. This "morphing" method provides a smooth, "analog-like," transition for the process parameters, thus eliminating or reducing the transition points, such as those visible in FIG. 1, 32,34. The transition from beginning to final values takes place over the user specified number of loops, providing control over the incremental values of the changes. Several sets of loops may be run in series if necessary. This allows gradual, timed transitions to be used in concert with loops involving fixed sets of parameters.

The Bosch process provided an advance by teaching the separation of the process into two discrete steps of etching and plasma deposition, and executing these steps in an alternating sequence for a given number of iterations before changing the process parameters. That advance involved the trade-off, as described above, of introducing discrete transition points. This trade-off is severe for MEMS applications, particularly as the density of a device is increased and the trench widths are thereby decreased.

As described in the background section, the capacitance of a device is affected by the spacing and geometry of the beams. Both the transition points and the trench wall dynamics contribute to the creation of beams which are not parallel to each other and which therefore do not have a constant spacing between them. Additionally, the transition points and trench wall dynamics limit the ability to control the trench walls and to produce a specified profile. These problems obviously become more severe as the density of a device is increased and the beam spacing is decreased.

The present invention addresses these needs which were not perceived by the Bosch patent and the Bosch process. This application teaches, amongst other things, automating the changing of the process parameters. Automating refers to designing the process such that the parameters can be programmed and/or changed without contemporaneous human intervention, for example and without limitation, by a computer-controlled system.

This automation allows reducing the number of iterations between changes to the process parameters, and changing the parameters more frequently, without requiring labor intensive or time intensive operations. The automation also allows the change in the process parameters to be arbitrarily small or selectable. The problem of discrete transitions during the etch is thereby solved and increased control is provided over the process and the resultant trench profile.

In one embodiment, the actual mathematical functions governing the morphing of the parameters are user selectable from a software dialogue box, and consist of linear and non-linear functions. Each process parameter can have a different mathematical function associated with it, and the function, coupled with the designated number of loops over which the function is to be applied, determines the rate of change of each of the parameters. Parameters with equal beginning and ending values are not varied during the morphing operation.

Each morphable parameter is assigned a BEGIN value, an END value, and a CURVE identifier. During the first iteration of the loop all of the parameters will be equal to their respective BEGIN values. During subsequent iterations of the loop the parameters will migrate, or morph, toward their END values. This process can also be referred to as transitioning or modifying the variable. On the final iteration of the loop, each parameter will be equal to its respective END value. The path each parameter takes to reach its END value is described by its CURVE identifier.

If the BEGIN and END values of a parameter are equal, then the parameter will behave as if it were not morphed, that is, as if it were constant. This is the default state for all morphable parameters until the user changes them. The END value also can be higher or lower than the BEGIN value.

The total number of iterations or loops over which a particular variable is to be morphed is used, along with the particular function selected, as stated above, to determine the rate of change of that variable. The changes to the morphed variable occur at the end of any given iteration. The morphed variable thus changes in a discontinuous, stair-step manner.

Figure 2:
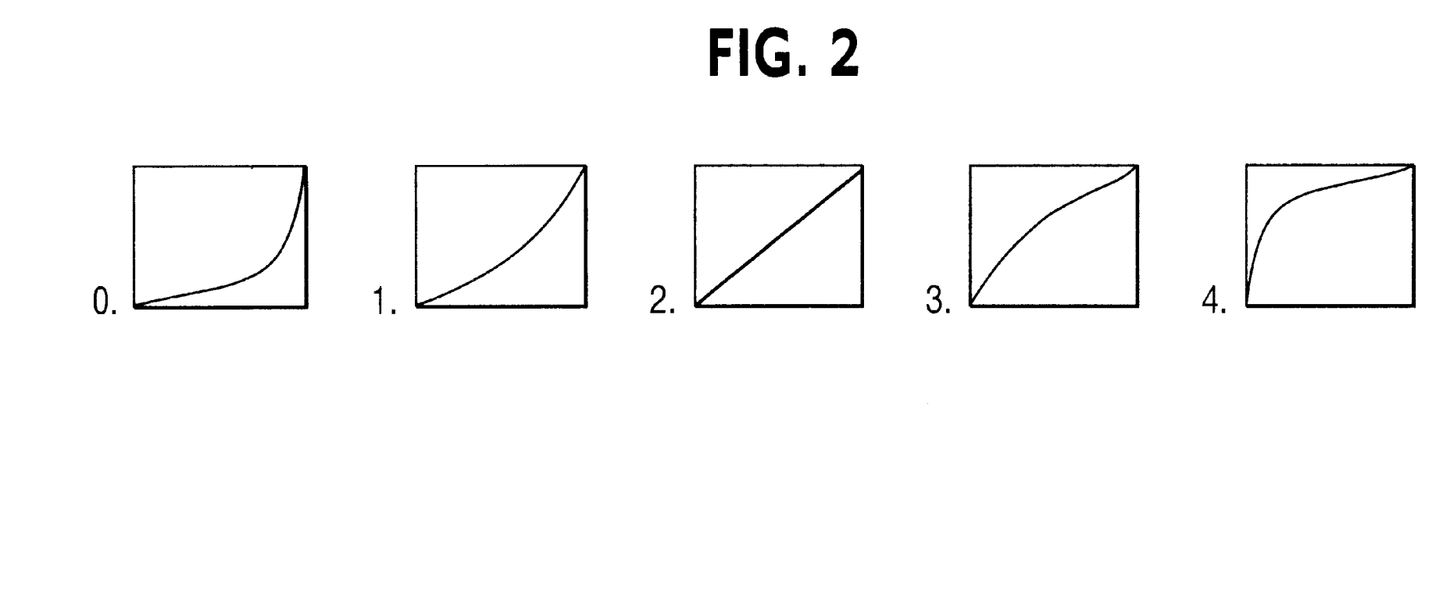
FIG. 2 illustrates five "canned" curves that can be used for morphing a parameter, according to an embodiment of the present invention.

Referring to FIG. 2, in particular implementations there are five "canned" curves. The first two curves have a non-decreasing slope, the third curve is linear, and the last two curves have a non-increasing slope. Each morphed parameter will follow its specified curve from the BEGIN value, lower left, to the END value, upper right. In the curves, the vertical axis represents the dependent variable which is the morphed parameter, and the horizontal axis represents the independent variable. Other curves, of course, are possible. Additionally, the curves may have a negative or zero slope or have portions with a negative or zero slope.

The morphed parameters also may be morphed in a continuous manner during the iterations themselves. Certain applications are amenable to using either continuous of discontinuous changes. In either case, the same curves can be used, with the parameter either substantially tracing the curve if the changes are continuous, or approximating it if the changes are discontinuous.

While the implementation will depend upon the application and the particular variable being morphed, one example of a variable that can be changed in either a continuous or discontinuous manner is as follows. A digitally-controlled variable may be changed in either a continuous or a discontinuous manner depending on the nature of the digital-to-analog ("D/A") converter that is used. Assuming that the variable is the output of the D/A converter, if the D/A converter ramps up or down to a new digitally-controlled level, then the variable will be continuous. If, however, the D/A converter jumps to a new level, then the variable will be discontinuous. An example, drawn from electrical circuits, is a typical D/A converter chip which is discontinuous. If, however, the proper capacitor is placed on the output, then the output will be continuous.

Further, the horizontal axis of the canned curves in FIG. 2, or any other curve, need not necessarily represent the number of iterations over which the variable is to be morphed. More generally, it may be any duration-marking variable, for example the elapsed time of the recipe. This may be even more desirable when a variable is being morphed on a continuous basis.

Further yet, while specified curves are optimal, any method of inputting a desired resultant trench can be used. A picture can be scanned in or otherwise inputted into the morphing system, for example, with a light pen and a light-sensitive screen.

Additionally, the automation need not be completely determined before the process begins. The process can be influenced by variables that are not known until run-time, such as by factors (also referred to as criteria) relating to other parts of the semiconductor device, equipment controlling the processing, or the semiconductor material being processed. Examples of run-time factors include, without limitation, the temperature of the semiconductor material, the aspect ratio of the trench, the depth of the trench, and the slope of the profile wall. The influence that these, or other, variables have on the process can vary greatly. Certain factors may act in a manner similar to interrupts and cause the process to terminate before the ending value of the morphed parameter is reached. This may occur, for example and without limitation, if a specified etch depth is reached or if a critical temperature is exceeded. Other factors, or the same ones, may be used by the process to change the manner in which the conditions are modified. This may occur, for example and without limitation, if a slope tolerance or other criterion is out of a specified range and triggers the modification of the process conditions. If a curve had been selected, then such modifications may include changing to another curve to govern the morphing parameter. Run-tine factors thus allow the use of feedback and provide for an adaptive system. Examples of such a system include without limitation using laser end-point detection to provide feedback on the etch depth, or more generally using in-situ monitoring of an etch progress to monitor the width or slope of the trench.

Figure 3:
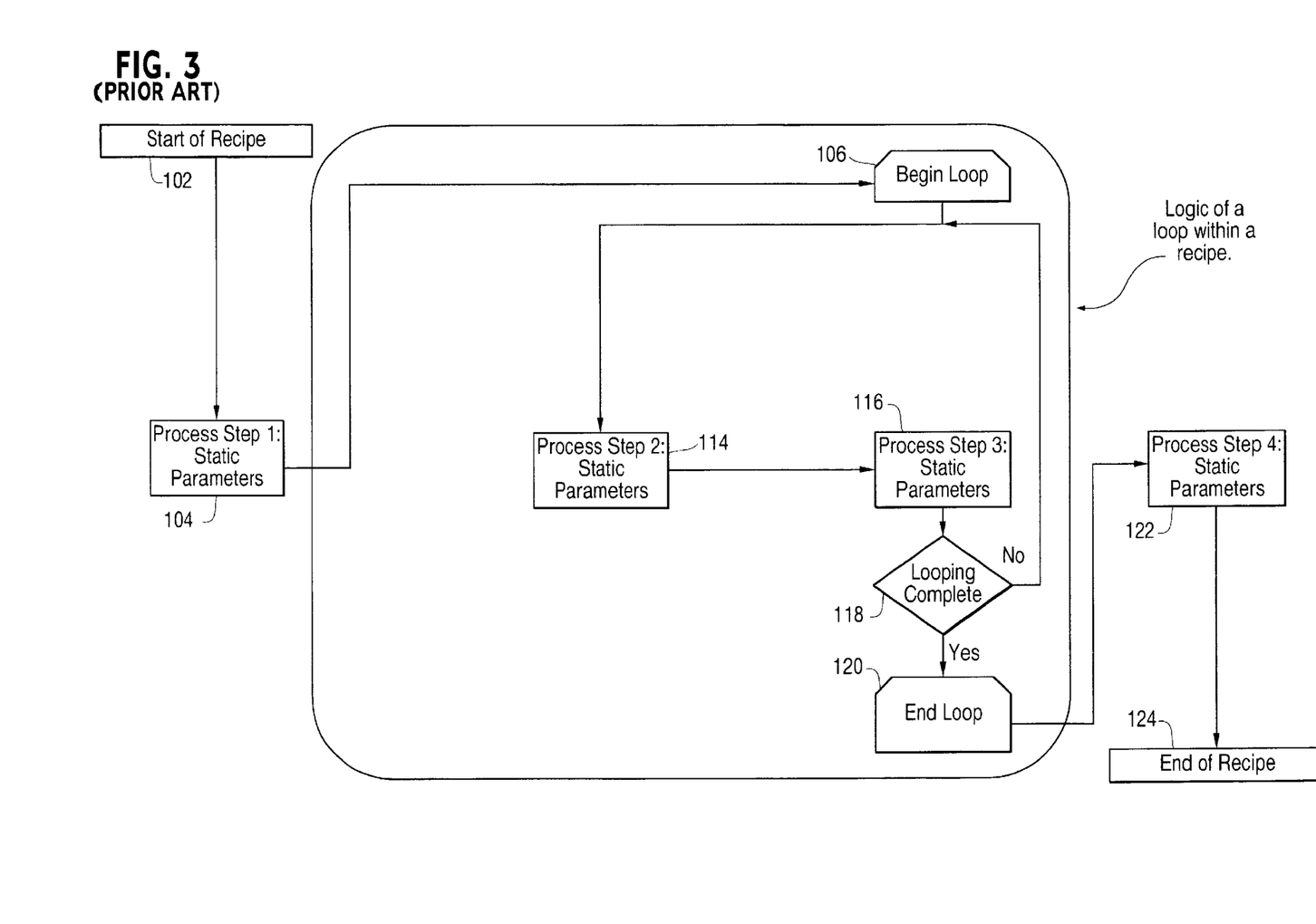
FIG. 3 is a flowchart showing the steps involved in a non-morphed loop, according to the prior art.
Figure 4:
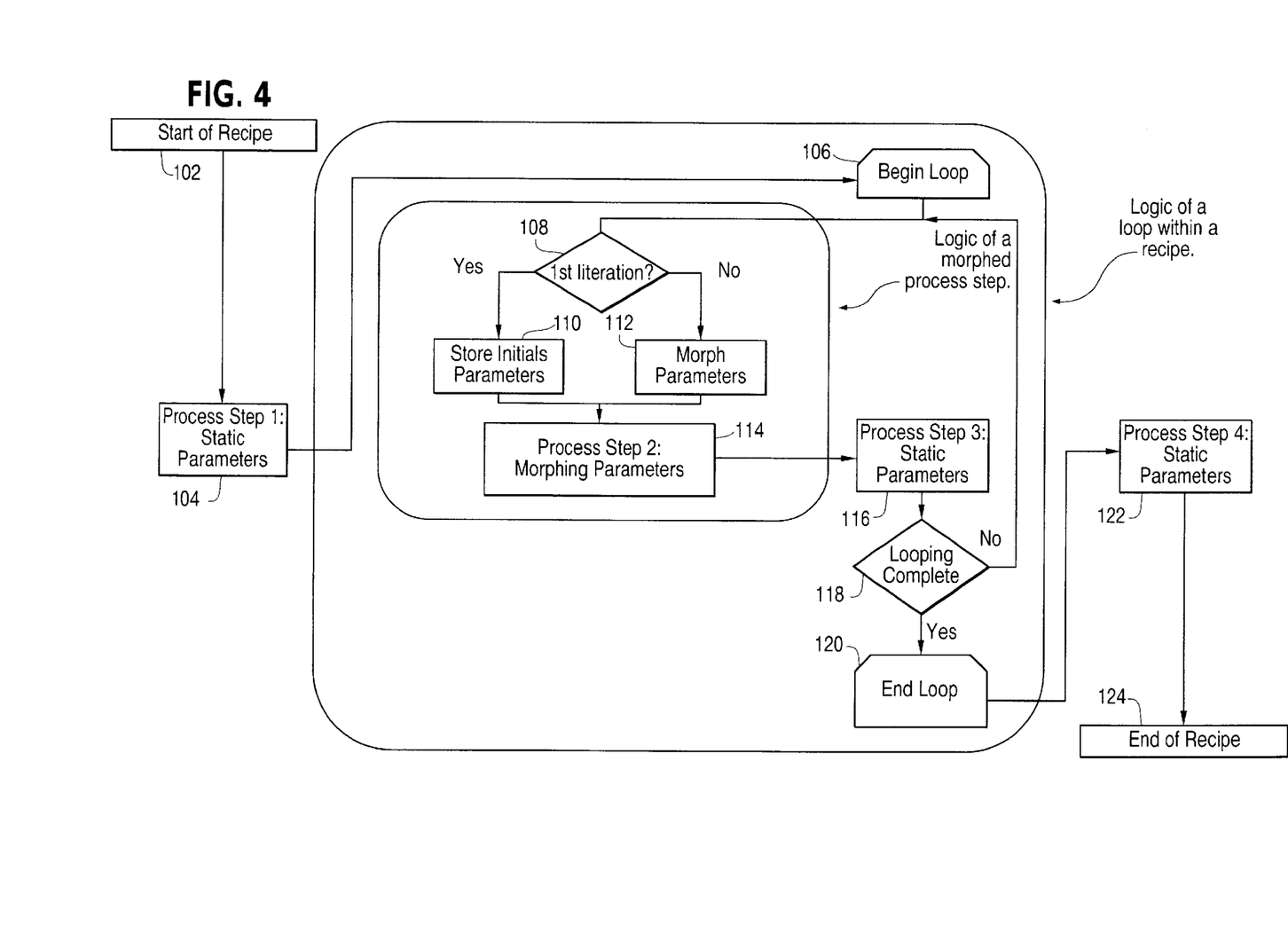
FIG. 4 is a flowchart showing the steps involved in a four-step process containing one morphed loop, according to an embodiment of the present invention.

Referring to FIGS. 3 and 4, there are shown flowcharts which describe a particular Bosch process and a particular morphed process. The flow charts are drawn to be largely identical so that the morphing aspect can be isolated.

In FIG. 3, which shows a flowchart for a loop set in the old Bosch process, the recipe starts 102 and then performs Process Step 1 with static parameters 104. This can be any process step including steps such as stabilization and ignition of the plasma. It could also be one etch step or one deposition step, for example. The loop set is then entered and the loop set begins 106. Process Steps 2 and 3 are then performed in sequence, both with static parameters, 114, 116. As with Process Step 1, Process Steps 2 and 3 can be any process steps. In a Bosch application, for example, Process Step 2 can be an etch cycle and Process Step 3 can be a deposition cycle. After Process Step 3 is complete, the recipe determines if another iteration is necessary 118, and either ends the loop set 120 or continues with further iterations 114–118. After the non-morphed loop set is completed 120, Process Step 4 is performed using static parameters 122 and the recipe ends 124.

In FIG. 4, there is shown a flowchart for a four-step recipe containing a morphed process step. It is the same as the flowchart of FIG. 3 with the addition of steps 108–112 and with a modification to step 114. After the loop set begins 106, the loop set determines if it is performing the first iteration, that is, the first loop 108. If it is the first iteration, then the initial parameters are stored 110 to be used in the processing step 114 for that iteration. If it is not the first iteration, then the appropriate parameters are morphed according to a preselected curve 112. A process step is then performed using either the initial or morphed parameters 114. As with the other process steps, Process Step 2 can be any process step, for example an etch cycle. Process Step 3 is then performed using static parameters 116. Again, Process Step 3 can be any process step. It is included inside the loop to demonstrate that not all process steps, and not all parameters, need to be morphed. This was also demonstrated earlier with FIG. 3 and a non-morphed loop. After Process Step 3 is complete, the recipe determines if another iteration is necessary 118, and either ends the loop set 120 or continues with further iterations 108–118. After the morphed loop set is completed 120, Process Step 4 is performed using static parameters 122 and the recipe ends 124.

The recipe of FIG. 4 is not necessarily that used for the morphed Bosch process, but can be used for such an application. For both FIG. 3 and FIG. 4, the process steps must be specified and the step duration must be measured. This can be done using a variety of methods including without limitation the use of a timer or more directly tracking the progress of the process itself.

Following are several examples of the morphing process being applied. These examples illustrate the advantages and unique capabilities of a user friendly morphing software package applied to the existing Bosch silicon etch technology.

EXAMPLE 1

Sculpting and General Performance

Figure 5:
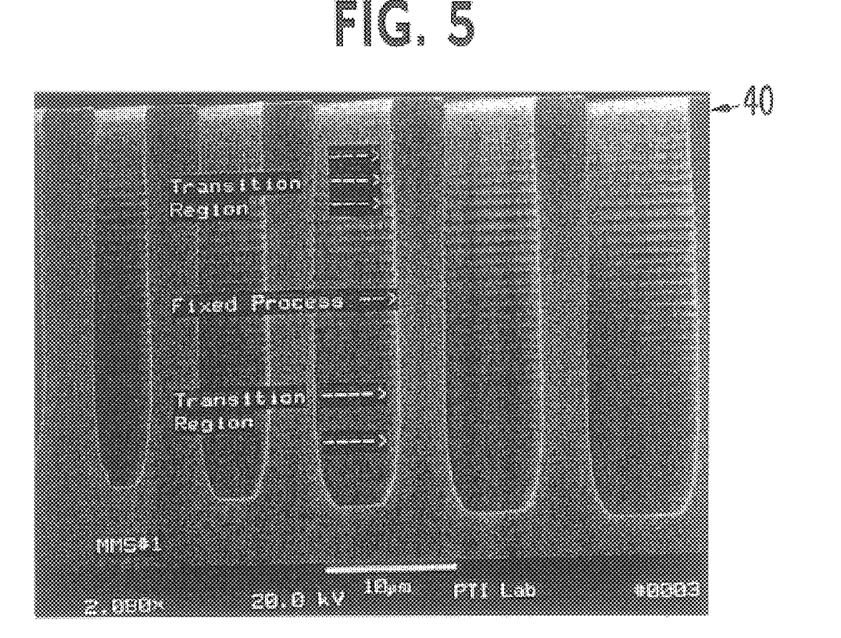
FIG. 5 depicts a trench profile created using morphing loops, according to an embodiment of the present invention.

An example of the effect of the morphing software implementation is illustrated in FIG. 5. Amongst other things, this example illustrates the ability of the morphing process (i) to sculpt a trench, (ii) to combat the tendency of trench profiles to change as the aspect ratio changes, and (iii) to be used with non-morphed steps or loop sets.

In this example, four sets of loops were utilized, including two morphed loop sets and two non-morphed loop sets. The first loop set is a short initial step for underetching control and was used for the mask layer and the portion immediately below the mask, roughly corresponding to the region above the reference numeral 40. This first loop set is non-morphed.

The second loop set roughly corresponds to the region below the reference numeral 40 down through the three arrows in the top "Transition Region." This second loop set is a morphed step where the etch parameters were transitioned from ones which yield more of a positive tapered profile, characterized by a narrowing trench, to those which result in a more re-entrant profile, characterized by a widening trench. The third loop set is a non-morphed loop set roughly corresponding to the region below the arrows of the top "Transition Region" and above the arrows of the bottom "Transition Region," indicated by the words "Fixed Process." This third loop set has process conditions which are fixed at settings which would etch in a vertical fashion. The fourth loop set is a second morphed loop set where the conditions transition from reentrant to those resulting in a positive slope. This fourth loop set roughly corresponds to the region beginning at the arrows of the bottom "Transition Region" and continues morphing the parameters all the way to the bottom of the trench. The closing, positive taper of the trench at the bottom is thus controlled by the morphing process.

The above example also illustrates a further, and more general, advantage of the morphing process. This advantage is the ability to control the profile during a high aspect ratio etch. During the course of a deep silicon trench etch, the aspect ratio of the feature changes with depth. As briefly mentioned earlier, this change in aspect ratio results in a change in trench profile during fixed parameter etching. Therefore, if the parameters are left unchanged, as the trench becomes deeper the profile of the etch will change. The morphing software is useful when changes in the process are desired to compensate for this shift in profile, while maintaining a smooth, uninterrupted wall profile. The second and fourth loop sets, which are morphed loop sets, demonstrate this advantage of the morphing process.

It is easy to see from the example that this technique offers the capability to literally sculpt the trench profiles to the desired shapes. Morphing software also provides the user with the capability to overcome another common difficulty associated with deep trench etching, as the following example illustrates.

EXAMPLE 2

Undercut Suppression

Figure 6:
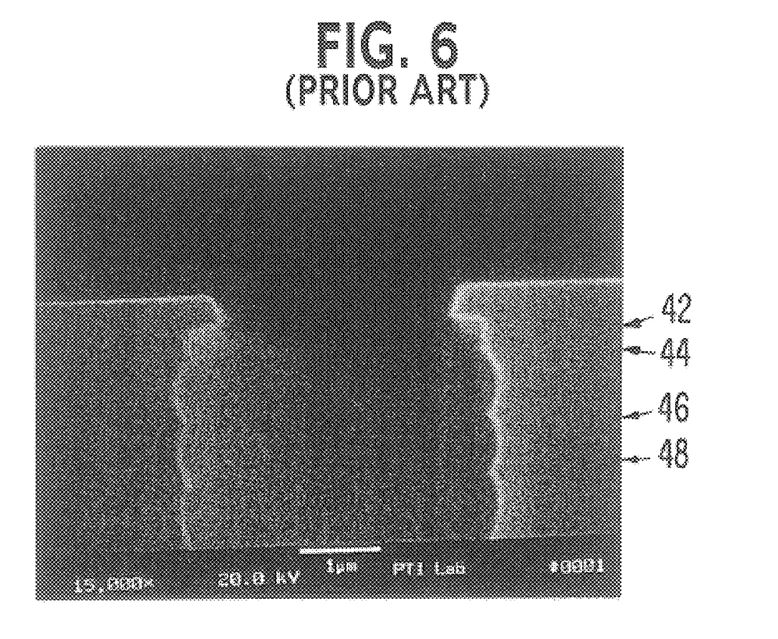
FIG. 6 shows undercutting at a mask/silicon interface, according to the prior art.

Morphing software is useful in cases where minimization or elimination of undercutting, also called underetching, at the mask/silicon interface is desired with a minimum of interruption between this aspect of the etch and the remaining bulk trench profile. An example of undercutting is shown in FIG. 6. Referring to FIG. 6, the initial undercut occurs at the depth indicated by reference numeral 42, and the entire trench remains undercut. Also visible are the three transition points at the depths indicated by reference numerals 44, 46, and 48 between each of the bottom four loop sets.

Figure 7:
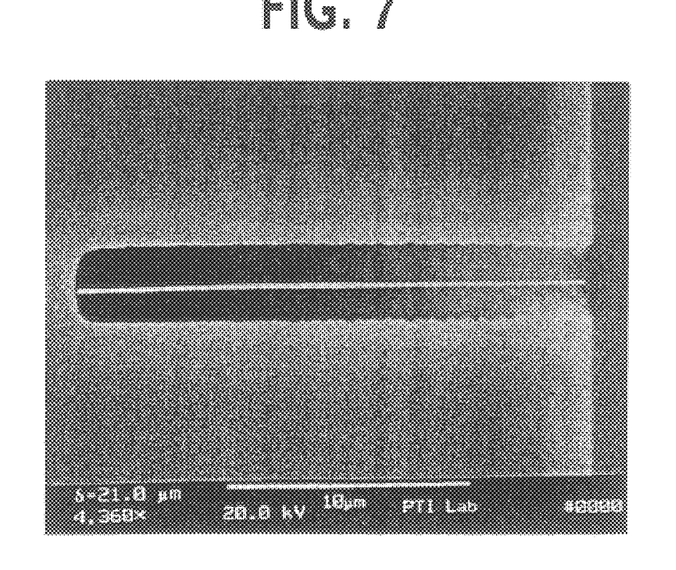
FIG. 7 depicts a morphing transition at a mask/silicon interface, according to an embodiment of the present invention.
Figure 8:
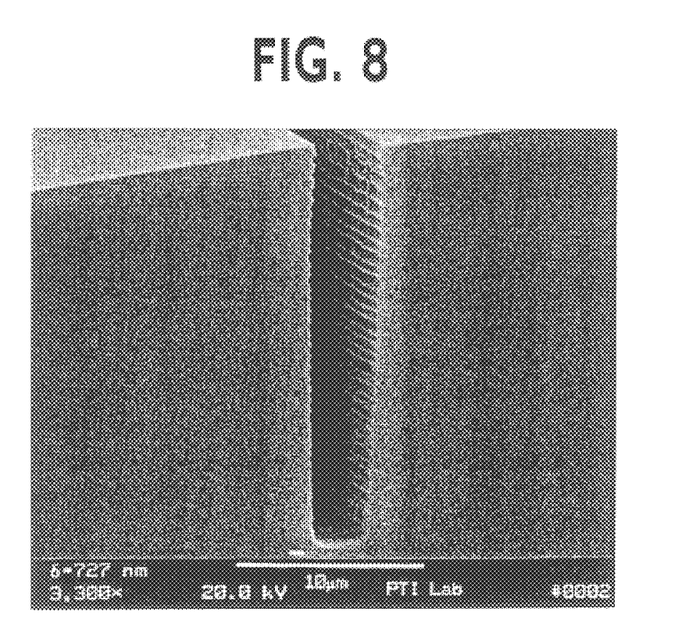
FIG. 8 shows a silicon trench created using a morphed undercut elimination step, according to an embodiment of the present invention.

The same geometry, etched using a morphed transition between the parameters designed to eliminate the undercut and the fixed, bulk silicon etch conditions, is shown in FIGS. 7 and 8. In these figures, the absence of undercut is apparent, and the transition between the two sets of etch conditions is invisible. From a quantitative standpoint, the undercut of FIG. 6 is on the order of 0.75 microns, whereas the undercut of FIGS. 7 and 8 is less than roughly 0.1 microns and can be reduced to practically zero.

This result can be directly compared to the etch results illustrated in FIG. 1. Some undercut is visible in FIG. 1, although it is not as severe as that in FIG. 6. Further, using the old Bosch process, the trench in FIG. 1 exhibits a stair-step profile such that the trench in FIG. 1 becomes more undercut at each transition point 32,34 as the depth increases. Conversely, the morphed process is able to sculpt the profile and allows the trench width to become gradually narrower if desired, as shown in FIGS. 5, 7, and 8.

The morphing process, therefore, not only allows the elimination of undercut, but allows it without the introduction of transition points. Morphed trench profiles can be substantially seamless, and the transitions can be virtually invisible.

The description above concentrated on describing the morphing algorithms for the process parameters. As one skilled in the art will recognize, there are a variety of other parameters and settings that are necessary in semiconductor fabrication processes. The Bosch patent, for example, details many of these process parameters. Some typical process materials and settings include: (i) etchant gases of $SF_6$, $O_2$, Ar, and/or fluorocarbon containing gases, (ii) pressure range between 0–200 mTorr, (iii) inductively coupled plasma ("ICP") power between 0–5 kW, (iv) radio frequency ("RF") power between 0–100 W, (v) wafer bias between 0–100 V, and (vi) process times from a few seconds up to 6 hours. Typical process results include: (i) silicon etch rates of up to 20 micrometer/min., (ii) Si:resist selectivities of greater than 75:1, (iii) Si:oxide selectivities of greater than 150:1, and (iv) process uniformities of less than 5%.

In the embodiments described above, the morphing process provides greater control over the slope of the etch, undercutting, transition points, maintaining an anisotropic etch despite a changing aspect ratio, and other trench characteristics. Additionally, the morphing process was applied to two processes, etching and deposition, in an alternating fashion. Morphing can be applied to any plasma process, and should not be restricted to any particular type of processing such as hi-density plasma processes, or inductively coupled plasma ("ICP") processes, or processes utilizing electron cyclotron resonance ("ECR"). Morphing can further be applied to T-coupled plasma processes and can be used with Mori reactors or any other type of reactor.

Clearly, the morphing process disclosed herein allows greater control over the process and the resultant, whether the process is etching, plasma formation, deposition, or some other application. As such, the morphing process has wide application outside of anisotropic etching.

The morphing process can be used with other processes, other combinations of processes, different requirements on the timing between the processes, or simply with a single process such as deposition. One example of this is the deposition of variable property and/or variable composition films. As an example, a passivation layer may be deposited using a morphing process such that the layer has a high oxygen content near the bottom, for mechanical flexibility, and such that the layer has a low oxygen content near the top, for sealing. The morphing process would thus allow greater continuity in the change in oxygen concentration with varying depth. The morphing process also would provide a quicker, more efficient process for changing the parameters governing the oxygen concentration. It is also clear that the morphing process can be used with materials or compositions other than silicon.

In light of the myriad applications amenable to morphing, the parameter which is morphed may further include any process variable, control variable, or other variable that is useful in describing the state of the process under control. Morphing can be applied to virtually any process where transitions in process parameters are required.

Figure 9:
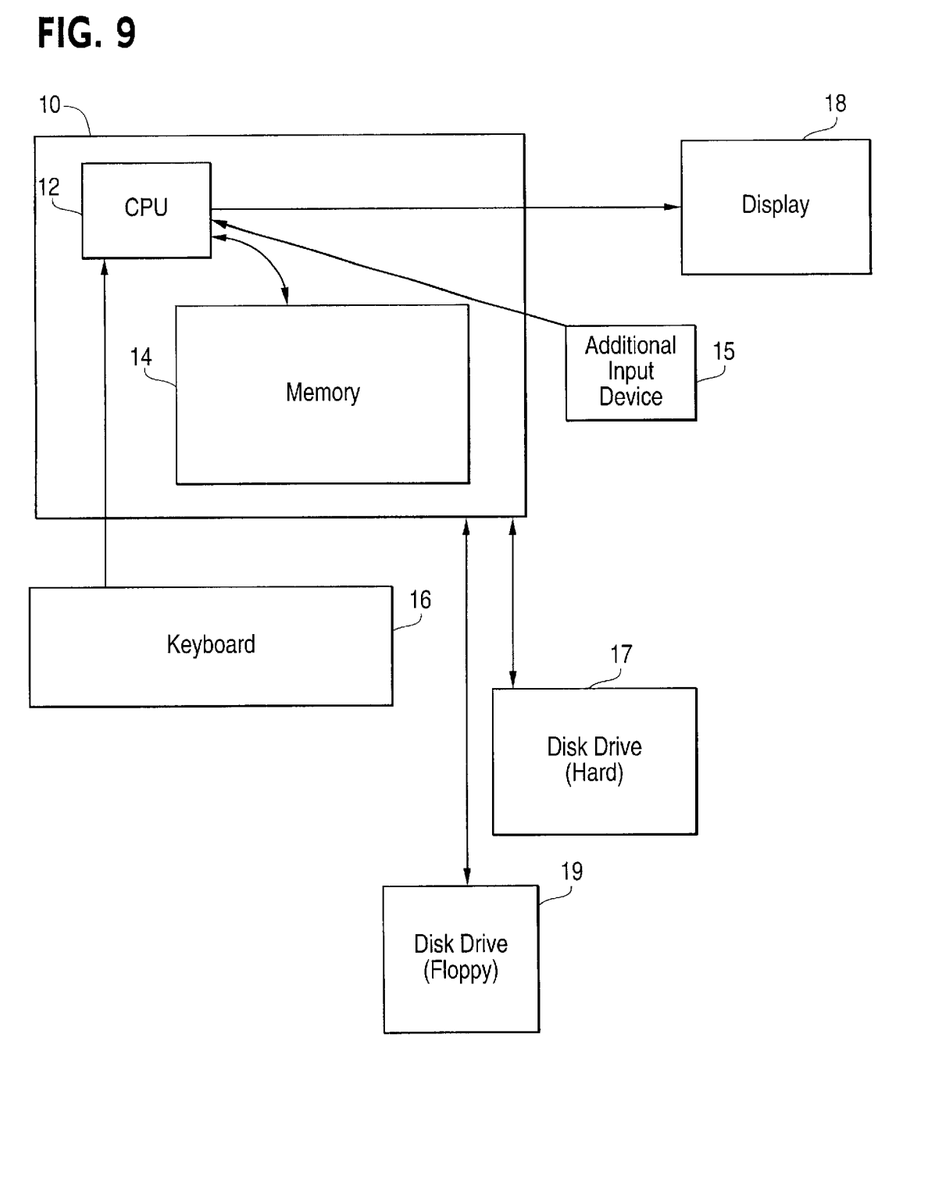
FIG. 9 shows a system for morphing a variable, according to an embodiment of the present invention.

The morphing process can be implemented in a variety of systems, as one skilled in the relevant art will understand in view of the teachings contained herein. Referring to FIG. 9, there is shown a particular implementation. A general purpose computer 10, containing a central processing unit ("CPU") 12 and a random access memory ("RAM") 14, is connected to a keyboard 16, a floppy drive 19, a hard disk 17, a monitor 18, and an additional input device 15.

The computer 10 runs a software program (not shown) which implements all of the processing required by the morphing process. The program can be written in any suitable language, including without limitation high-level languages such as C++, mid-level and low-level languages, and assembly languages. The logic can also be embedded in an application specific integrated circuit ("ASIC") or other device. Embodiments may utilize industrialized versions of either a 486 or Pentium PC computer that is running either Windows 3.1, Windows 95, or Windows 98. The PC runs custom control software written in C and/or C++. Other embodiments can employ other available computer systems, including without limitation specific-purpose computers.

The computer 10 also interfaces with a user (not shown) to accept input for selecting a beginning value, an ending value, a curve, a criterion which describes a desired result of the processing, and/or any other required information. The input device may be the keyboard 16 or the like, a file resident on the hard disk 17 or the like or some other computer readable medium, the CPU 12 or the like which may run another program which generates the input, the RAM 14 or the like which may temporarily store such generated information or even information received over a communications line (not shown), or the additional input device 15 or the like which may represent, for example and without limitation, a mouse, a voice recognition system, or a touch screen. It is clear that the "user" may be an individual, another program(s), a file(s), a processor(s), or some other "entity," and that referring to a "user" does not limit the present invention.

The computer 10 also interfaces the additional input device 15 for receiving an input which can be used to determine whether a variable parameter needs to be modified in order to satisfy any criteria that may have been selected. The additional input device 15 may represent, for example and without limitation, a temperature sensor, a camera, or a device which measures trench depth. Such an embodiment will support, amongst others, applications in which the end value of the morphed parameter and the function to be followed are not necessarily known when the process begins.

Note that an ending value, for those applications which use one, need not be selected directly, but may implicitly be selected. This may be done, for example, by simply selecting the curve and specifying a duration time.

The computer 10 also may perform the initialization of the parameter that is to be morphed and automatically update the parameter according to a selected function. The automatic updates are performed in conjunction with the processing of the semiconductor device. The exact nature of how the updates are performed in conjunction with the processing depends on the application and its implementation. In the embodiment for a morphed Bosch process described above, the automatic updates occur after each iteration of the two processes.

Other embodiments, however, may update the parameters in other fashions, including without limitation, updating the parameters in the middle of an iteration, after a specified number of iterations greater than one, after a varying number of iterations, and when a certain etch depth or deposition depth is achieved. Other applications of the morphing process, operating perhaps with different processes, may continually update the parameters or use some other mechanism to perform the updates in conjunction with the processing.

In embodiments which utilize a criterion, the computer 10 also may determine a beginning value for a variable parameter based on any selected criteria. Further, in embodiments which receive an input, the computer 10 also may determine, from the received input, whether a variable parameter needs to be modified in order to satisfy any selected criteria, and modify such a variable parameter in an automated fashion in order to satisfy such criteria. Examples include, without limitation, maintaining a trench wall slope within a specified tolerance.

The computer 10 also may interface with the "user" by providing output via the display 18. Such output may include, without limitation, prompts or process information. Other output devices also may include, without limitation, a speaker, a printer, a file stored on the hard drive 17, a file stored on a floppy inserted into the floppy drive 19, another program running on the CPU 12 and using the RAM 14, or an antenna or other communications device.

The computer 10 may utilize an internal clock for timing the duration of the etch and deposition cycles. Other embodiments may utilize, for example and without limitation, an optical device which tracks the process's progress, or some other mechanism to track and/or control the process.

The computer 10 will interface with the equipment which controls the actual processing of the semiconductor device. In the embodiment described above for a morphed Bosch process, the computer 10 will interface with, and at least partially control, the hardware for etching the semiconductor device and the hardware for performing the plasma deposition. These devices are described in the Bosch patent or are standard state of the art plasma processing platforms which are known to those skilled in the art. In other embodiments, these devices themselves may also be used to initialize the morphable parameters and automatically update them. This may be achieved, for example, by the computer 10 sending data or signals to the processing equipment, or by the processing equipment interfacing directly with the user. In the latter case, the processing equipment itself would contain at least some of the components contained in FIG. 9.

It is to be understood that the description, specific examples and data, while indicating exemplary embodiments, are given by way of illustration and are not intended to limit the present invention. Various changes and modifications within the present invention will become apparent to the skilled artisan from the discussion, disclosure and data contained herein, and thus are considered part of the invention.

What is claimed is:

1. A method for controlling a variable parameter during a processing of a semiconductor device, the method comprising:

selecting a beginning value and an ending value for the variable parameter, wherein the beginning value is not equal to the ending value;

selecting a function governing how the variable parameter is to be transitioned from the beginning value to the ending value;

initializing the variable parameter to the beginning value; and automatically transitioning the variable parameter according to the selected function.

2. The method of claim 1 for controlling a variable parameter during a processing of a semiconductor device, wherein the selected function contains a discontinuity in a dependent variable as a function of a independent variable.

3. The method of claim 1 for controlling a variable parameter during a processing of a semiconductor device, further comprising performing a static loop, wherein the variable parameter is not varied during a portion of the processing of the semiconductor device.

4. The method of claim 1 for controlling a variable parameter during a processing of a semiconductor device, wherein the selected function is a linear function from the beginning value to the ending value.

5. The method of claim 1 for controlling a variable parameter during a processing of a semiconductor device, wherein the automatic transitioning of the variable parameter results in the variable parameter only approximating the selected function.

6. The method of claim 1 for controlling a variable parameter during a processing of a semiconductor device, wherein the variable parameter is automatically transitioned from the beginning value all the way to the ending value.

7. The method of claim 1 for controlling a variable parameter during a processing of a semiconductor device, wherein the ending value is selected implicitly.

8. The method of claim 1 for controlling a variable parameter during a processing of a semiconductor device, further comprising performing the processing of the semiconductor device, wherein the performing is undertaken after initializing the variable parameter to the beginning value and is performed in conjunction with the automatically transitioning the variable parameter according to the selected function.

9. The method of claim 8 for controlling a variable parameter during a processing of a semiconductor device, wherein the processing which is performed on the semiconductor device comprises an inductively coupled plasma process.

10. The method of claim 8 for controlling a variable parameter during a processing of a semiconductor device, wherein the performing the processing comprises both a first process and a second process alternatingly for a specified number of iterations.

11. The method of claim 10 for controlling a variable parameter during a processing of a semiconductor device, wherein the first process is an etching process and the second process is a plasma deposition process.

12. The method of claim 10 for controlling a variable parameter during a processing of a semiconductor device, wherein the first process is a plasma deposition process and the second process is an etching process.

13. The method of claim 11 for controlling a variable parameter during a processing of a semiconductor device, wherein the selected function has at least one independent variable selected from the group consisting of elapsed time, depth of the etch, and number of iterations.

14. A computer program product comprising computer readable program code for causing a controlling of a variable parameter during a processing of a semiconductor device, wherein the program code in the computer program product comprises:

a first computer readable program code for selecting a beginning value and an ending value for the variable parameter, wherein the beginning value is not equal to the ending value;

a second computer readable program code for selecting a function governing how the variable parameter is to be transitioned from the beginning value to the ending value;

a third computer readable program code for initializing the variable parameter to the beginning value; and a fourth computer readable program code for automatically transitioning the variable parameter according to the selected function.

15. The computer program product of claim 14, wherein the program code in the computer program product further comprises:

a fifth computer readable program code for performing the processing of the semiconductor device, wherein the processing is performed after initializing the variable parameter to the beginning value and in conjunction with automatically transitioning the variable parameter according to the selected function.

16. The computer program product of claim 15, wherein the fifth computer readable program code for performing the processing of the semiconductor device comprises computer readable program code for performing both a first process and a second process alternatingly for a specified number of iterations.

17. The computer program product of claim 16, wherein the first process is an etching process and the second process is a plasma deposition process.

18. A system for controlling a variable parameter during a processing of a semiconductor device, the system comprising:

means for selecting a beginning value and an ending value for the variable parameter, wherein the beginning value is not equal to the ending value;

means for selecting a function governing how the variable parameter is to be transitioned from the beginning value to the ending value;

means for initializing the variable parameter to the beginning value; and means for automatically transitioning the variable parameter according to the selected function.

19. The system of claim 18, further comprising means for performing the processing of the semiconductor device, wherein the processing is performed after initializing the variable parameter to the beginning value, and wherein the processing is performed in conjunction with automatically transitioning the variable parameter according to the selected function.

20. The system of claim 19, wherein the means for performing the processing comprises means for performing a first process and means for performing a second process, wherein the first and second processes are to be performed alternatingly for a specified number of iterations.

21. The system of claim 20, wherein the first process is an etching process and the second process is a plasma deposition process.

22. A method for controlling a variable parameter during a processing of a semiconductor device, the method comprising:

selecting a criterion that describes a desired result of the processing;

determining a beginning value for the variable parameter, based in part on the selected criterion;

receiving during the processing of the semiconductor device an input that can be used to determine whether the variable parameter needs to be modified in order to satisfy the selected criterion;

determining from the received input whether the variable parameter needs to be modified in order to satisfy the selected criterion; and modifying the variable parameter in an automated fashion in an attempt to satisfy the selected criterion.

23. The method of claim 22 for controlling a variable parameter during a processing of a semiconductor device, further comprising repeating (i) receiving the input, (ii) determining whether the variable parameter needs to be modified, and (iii) modifying the variable parameter.

24. A system for controlling a variable parameter during a processing of a semiconductor device, the system comprising:

an interface adapted to allow the selection of a criterion that describes a desired result of the processing;

an initializer adapted to determine a beginning value for the variable parameter, based in part on the selected criterion;

an input device for receiving during the processing of the semiconductor device an input that can be used to determine whether the variable parameter needs to be modified in order to satisfy the selected criterion;

a determiner adapted to determine from the received input whether the variable parameter needs to be modified in order to satisfy the selected criterion; and a modifier adapted to modify the variable parameter in an automated fashion in an attempt to satisfy the selected criterion.

25. A computer program product comprising computer readable program code for causing a controlling of a variable parameter during a processing of a semiconductor device, wherein the program code in the computer program product comprises:

a first computer readable program code for selecting a criterion that describes a desired result of the processing;

a second computer readable program code for determining a beginning value for the variable parameter based in part on the selected criterion;

a third computer readable program code for receiving during the processing of the semiconductor device an input that can be used to determine whether the variable parameter needs to be modified in order to satisfy the selected criterion;

a fourth computer readable program code for determining from the received input whether the variable parameter needs to be modified in order to satisfy the selected criterion; and a fifth computer readable program code for modifying the variable parameter in an automated fashion in an attempt to satisfy the selected criterion.

26. A system for controlling a variable parameter during a processing of a semiconductor device, the system comprising:

an interface adapted to allow the selection of a beginning value and an ending value for the variable parameter, wherein the beginning value is not equal to the ending value;

a selector adapted for selecting, from a plurality of functions, a function governing how the variable parameter is to be transitioned from the beginning value to the ending value, wherein said plurality of functions comprises at least one function comprising a curve with a portion comprising at least one of an increasing slope or a decreasing slope;

an initializer adapted to initialize the variable parameter to the beginning value; and a processor for automatically transitioning the variable parameter according to the selected function.

27. A method for controlling a variable parameter during a processing of a semiconductor device, the method comprising:

selecting a beginning value and an ending value for the variable parameter, wherein the beginning value is not equal to the ending value;

selecting, from a plurality of functions, a function governing how the variable parameter is to be transitioned from the beginning value to the ending value, wherein said plurality of functions comprises at least one function comprising a curve with a portion comprising at least one of an increasing slope or a decreasing slope;

initializing the variable parameter to the beginning value; and automatically transitioning the variable parameter according to the selected function.

28. A computer program product comprising computer readable program code for causing a controlling of a variable parameter during a processing of a semiconductor device, wherein the program code in the computer program product comprises:

a first computer readable program code for selecting a beginning value and an ending value for the variable parameter, wherein the beginning value is not equal to the ending value;

a second computer readable program code for selecting, from a plurality of functions, a function governing how the variable parameter is to be transitioned from the beginning value to the ending value, wherein said plurality of functions comprises at least one function comprising a curve with a portion comprising at least one of an increasing slope or a decreasing slope;

a third computer readable program code from initializing the variable parameter to the beginning value; and a fourth computer readable program code for automatically transitioning the variable parameter according to the selected function.

* * * * *